United States Patent [19]

Lipp

[11] Patent Number: 4,975,640

[45] Date of Patent: Dec. 4, 1990

[54] METHOD FOR OPERATING A LINEAR FEEDBACK SHIFT REGISTER AS A SERIAL SHIFT REGISTER WITH A CROSSCHECK GRID STRUCTURE

[75] Inventor: Robert J. Lipp, Los Gatos, Calif.

[73] Assignee: CrossCheck Technology, Inc., San Jose, Calif.

[21] Appl. No.: 482,458

[22] Filed: Feb. 20, 1990

[51] Int. Cl.[5] .................... G06F 11/00; H03K 19/177
[52] U.S. Cl. ............................... 324/158 R; 324/73.1; 371/22.6; 307/465
[58] Field of Search ......................... 324/158 R, 73.1; 371/22.6, 15.1, 22.1; 307/243, 465

[56] References Cited

U.S. PATENT DOCUMENTS

| | | | |
|---|---|---|---|
| 4,377,757 | 3/1983 | Konemann et al. | 307/465 |
| 4,701,917 | 10/1987 | Jones et al. | 371/15.1 |
| 4,742,252 | 5/1988 | Agrawal | 307/465 |
| 4,749,947 | 6/1988 | Gheewala | 371/22.6 |
| 4,857,774 | 8/1989 | El-Ayat et al. | 371/21.6 |
| 4,942,318 | 7/1990 | Kawana | 307/465 |

OTHER PUBLICATIONS

McCluskey, "Built-In Self-Test Techniques", *IEEE Design & Test*, pp. 21–28, (Apr. 1985).
Savir, "Probabilistic Test", *Built-In Test-Concepts and Techniques*, pp. 57–79.
McCluskey, "Input Test Stimulus Generation", *Built--In Test Concepts and Techniques*, pp. 37–56.
Gloster, et al., "Boundary Scan with Built-In Self-Test", *IEEE Design & Test of Computers*, pp. 36–44, (Feb. 1989).
"SR44: 4 Bit Shift Register, Synchronous Parallel Load," *LSI Compacted Array Data Book*, pp. 13–177, LSI Logic Corp., (1986).

Primary Examiner—Ernest F. Karlsen
Assistant Examiner—Vinh P. Nguyen
Attorney, Agent, or Firm—Townsend and Townsend

[57] ABSTRACT

A method for operating a multiple input linear feedback shift register (LFSR) as a conventional shift register so that input multiplexers can be eliminated on each parallel input when associated with a CrossCheck matrix. A linear feedback shift register coupled through sense lines of a CrossCheck test matrix is operated as a serial shift register by inputting serial data at the serial data input while maintaining parallel input lines at a zero logic level. Further, zero logic level serial data (null data) is input serially through the shift register prior to the enabling of the parallel input. The method significantly reduces the number of logic structures required to shift the data out serially.

6 Claims, 3 Drawing Sheets

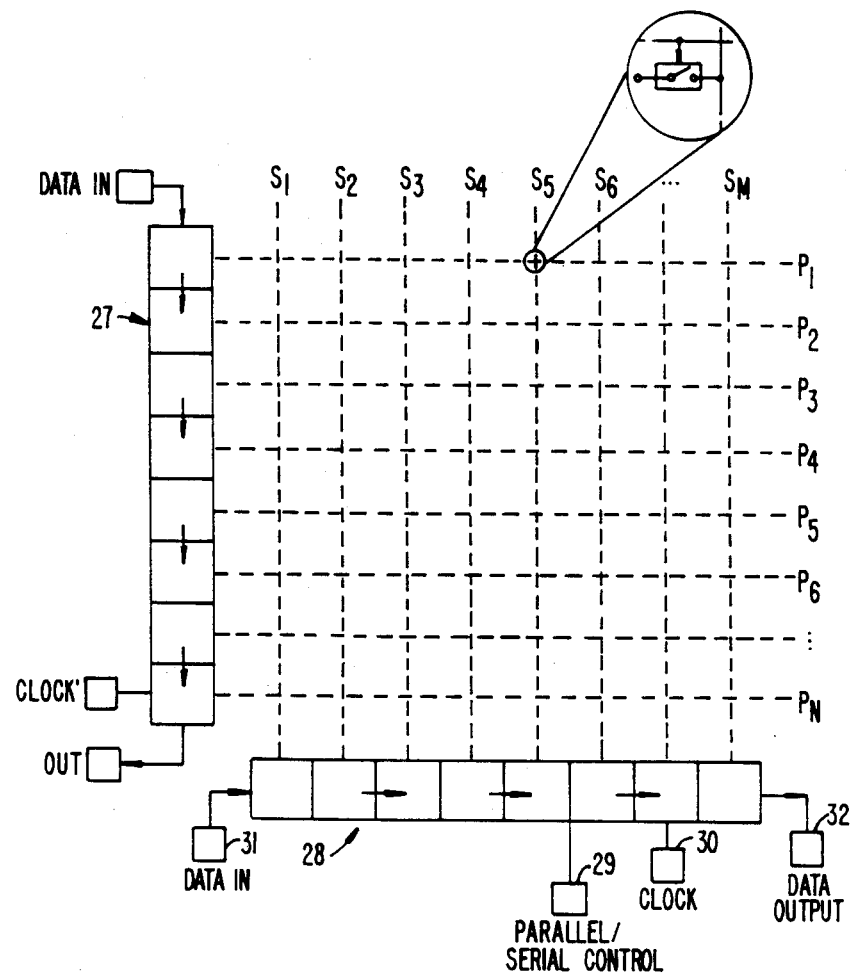
PRIOR ART
FIG._1.

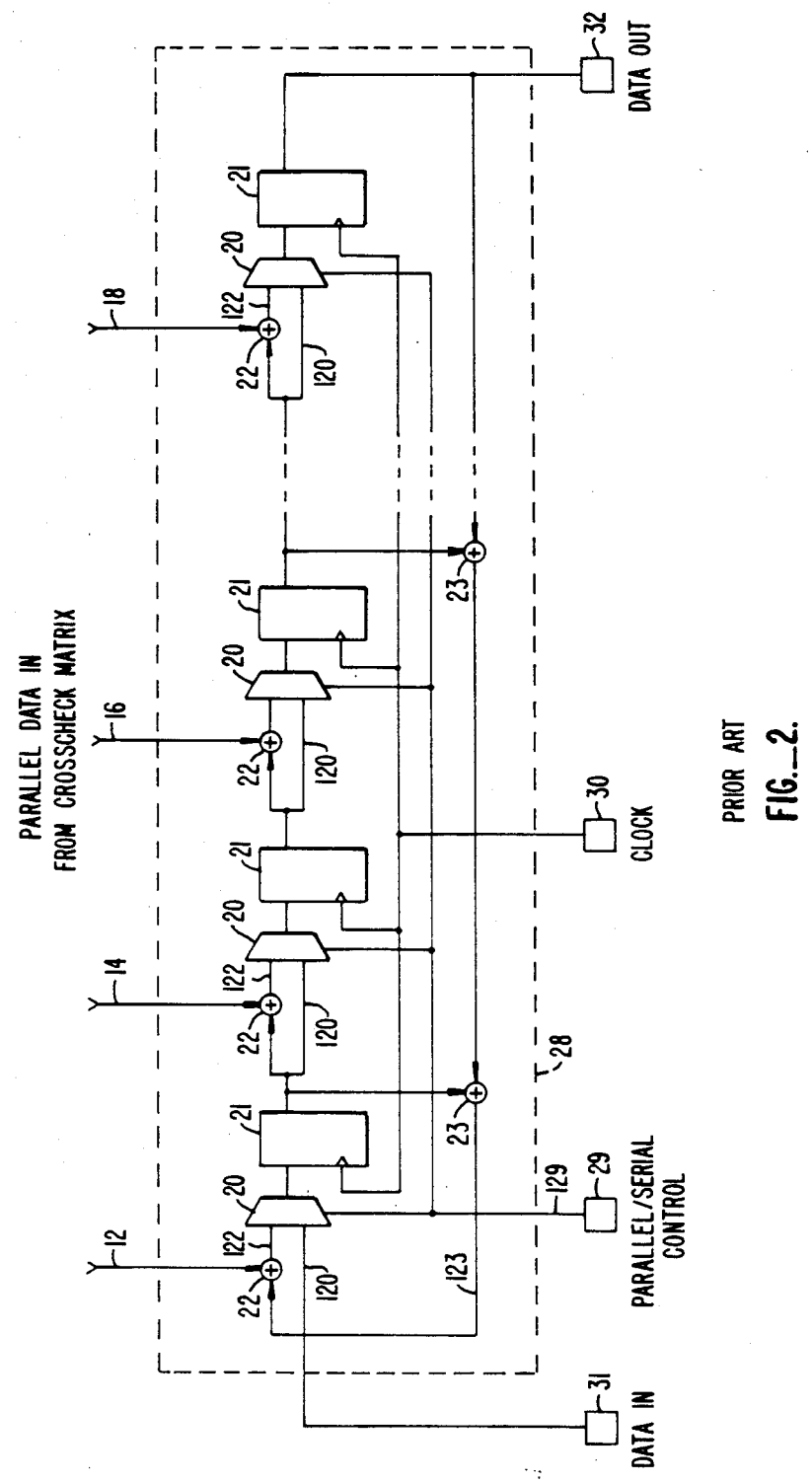
FIG._2.
PRIOR ART

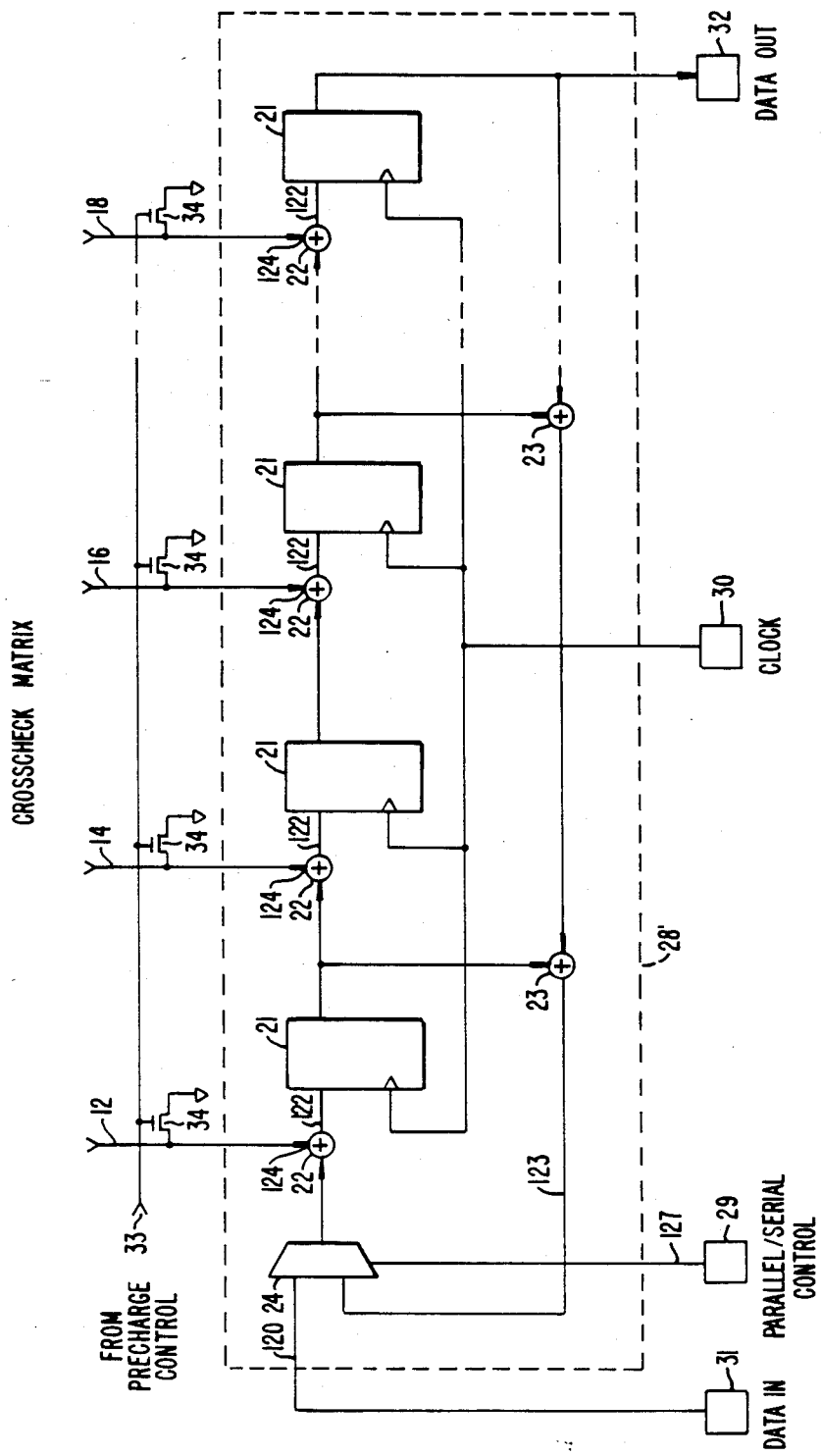
FIG._3.

METHOD FOR OPERATING A LINEAR FEEDBACK SHIFT REGISTER AS A SERIAL SHIFT REGISTER WITH A CROSSCHECK GRID STRUCTURE

BACKGROUND OF THE INVENTION

This invention relates to a method for reading out data from a linear feedback shift register (LFSR) used to compress data collected from a grid structure of an integrated circuit, particularly a grid structure of the type described as a CrossCheck grid structure. In particular, it relates to a method for operating an LFSR as a conventional shift register with minimal additional circuitry when connected to such a grid.

The CrossCheck grid structure is a proprietary diagnostic structure embedded in Very Large Scale Integrated (VLSI) circuits and employed in connection with diagnostics to test the integrity of the integrated circuits. As used herein, a CrossCheck grid structure refers specifically to a matrix in a VLSI integrated circuit of probe lines and sense lines interconnected by switches controlled by the probe lines and used to monitor signals applied by the switches to the selected sense lines at randomly-designated sites in the integrated circuit and wherein there is no storage of diagnostic information at the nodes, i.e., at the crossings of the sense lines and the probe lines. The CrossCheck method of testing an integrated circuit generates very large quantities of data. One technique for dealing with this data is to generate a signature from the patterns created by the data and then to read the signature to obtain an indication of existence of faults by comparison with a template signature of a known good IC. This was described in Tushar Gheewala U.S. Pat. No. 4,749,947, entitled GRID-BASED, "CROSS-CHECK" TEST STRUCTURE FOR TESTING INTEGRATED CIRCUITS. This patent is incorporated herein by reference and made a part hereof. FIG. 1 herein is an illustration from the Gheewala patent which shows the use of a linear feedback shift register (LFSR) 28. Also represented is a Serial/Parallel Control 29 used to convert the LFSR 28 to a conventional shift register.

While in test mode, the LFSR 28 operates in its parallel input mode, inputting data from the sense lines $S_1$ through $S_N$ of the CrossCheck grid or matrix. After testing is complete, the LFSR 28 is switched to its serial operation mode by means of a control signal from the Serial/Parallel Control 29. The signature is then serially shifted out to a Data Output terminal 32.

Providing the logic structures necessary to control Serial/Parallel operation adds considerable overhead to this type of circuit. What is needed is a technique to operate this type of shift register without substantial structural overhead.

The following publications provide background information relevant to the present invention.

"SR44: 4 Bit Shift Register, Synchronous Parallel Load," *LSI Compacted Array Data Book*, page 13-177, LSI Logic Corp., (1986). This data sheet shows the network schematic diagram of a VLSI circuit for a shift register wherein a multiplexer (MUX) is employed to convert between serial and parallel operation. It corresponds to FIG. 1 (Prior Art) herein.

McCluskey, "Built-In Self-Test Techniques", *IEEE Design & Test of Computers*, pp. 21-28, (April 1985), describes built-in self test techniques using linear feedback shift registers for pattern generation and response. FIG. 5 therein shows an LFSR configured as a parallel signature analyzer.

Savir, "Probabilistic Test", *Built-In Test—Concepts and Techniques*, pp. 57-79, is a survey describing various random and built-in test techniques using linear feedback shift registers which addresses error masking and fault masking problems and evaluation procedures.

McCluskey, "Input Test Stimulus Generation", *Built-In Test—Concepts and Techniques*, pp. 37-56, is another survey article on exhaustive test techniques.

Gloster, et al., "Boundary Scan with Built-In Self-Test", *IEEE Design & Test of Computers*, pp. 36-44, (February 1989), describes a boundary scan technique with built-in self-test using CAR and LFSR principles.

LeBlanc, "LOCST: A Built-In Self-Test Technique", *IEEE Design & Test of Computers*, pp. 45-52 (November 1984), describes a linear feedback shift register having a multiplexer at its input (See FIG. 3 therein).

SUMMARY OF THE INVENTION

In accordance with the invention, a method is provided for operating a multiple input linear feedback shift register (LFSR) as a conventional shift register so that input multiplexers can be eliminated on each parallel input when associated with a CrossCheck matrix. A linear feedback shift register coupled through sense lines of a CrossCheck test matrix is operated as a serial shift register by inputting serial data at the serial data input while maintaining parallel input lines at a zero logic level. Further according to the invention, zero logic level serial data (null data) is input serially through the shift register prior to the enabling of the parallel input. The method significantly reduces the number of logic structures required to shift the data out serially.

The invention will be better understood by reference to the following detailed description in connection with the accompanying drawings.

BRIEF DESCRIPTION OF THE DRAWINGS

FIG. 1 is a circuit diagram of a prior art CrossCheck grid structure illustrating the use of an unmodified LFSR on a CrossCheck matrix;

FIG. 2 is a circuit diagram of a typical prior art LFSR as employed in a structure of FIG. 1; and FIG. 3 is a circuit diagram illustrating an LFSR operative in accordance with the method of the invention.

DESCRIPTION OF SPECIFIC EMBODIMENTS

FIG. 1 has been previously described.

FIG. 2 illustrates a conventional LFSR 28 operative according to the conventional method for converting a parallel loaded LFSR to a serial shift register, in connection with a CrossCheck matrix. The CrossCheck matrix employs as output a plurality of sense lines, as represented by sense lines 12, 14, 16, 18. Flip-flops 21 operating together form a shift register. Dual-input multiplexers 20 are disposed at the input of every flip-flop 21 in the circuit 28. Under the control of input 129 the serial/parallel control input 29, each multiplexer 20 selects either the serial input 120 from the previous stage of the register 28 or the parallel input 122 from the CrossCheck matrix via sense lines 12, 14, 16, 18.

In the "test", or data compression mode, the LFSR 28 is configured as a parallel-input LFSR. The data from the matrix (lines 12, 14, 16, 18) is thus combined with the pre-existing data in the bit registers 21 by means of exclusive-OR gates 22. Specifically, the multiplexers 20, under the control of the serial/parallel control device 29 via line 129, steer this data to the flip-flop bit registers 21 where it is clocked into the individual registers 21 under control of the clock 30. Exclusive-OR gates 23 provide coupling to a feedback path 123 to complete the LFSR construction.

In "shift", or serial mode, multiplexers 20 allow data to propagate from the Data In terminal 31, through the individual bit registers, to the Data Out terminal 32.

According to the invention, and referring to FIG. 3, a linear feedback shift register 28' coupled through sense lines 12, 14, 16, 18 of a CrossCheck test matrix is operated as a serial shift register by inputting serially data at the serial data input 31 while maintaining parallel input lines at a zero logic level. Multiplexers 20 between bit registers 21 of the type shown in FIG. 2 are eliminated by adoption of this operating technique. The sense lines of the matrix are effectively disabled during serial data input. Further according to the invention, zero logic level serial data (null data) is input serial through the shift register prior to the enabling of the parallel input. The serial data input is disabled during matrix data input.

Null data is clocked either into the serial input or from the parallel inputs. The structure supporting this technique requires only one multiplexer 24 at the data input terminal 31 whereby all feedback is from feedback line 123, exclusive-OR gates 22 at the input of each bit register 21 are provided and the matrix data input terminal 124 of each exclusive-OR gate 22 is controllably driving it to a zero logic level. In this state, each exclusive-OR gate 22 passes the serial data signal through without change. Instead of multiplexing the inputs, the inputs from the matrix are connected to a zero logic level. When clocked by a clock 30, each bit register 21 serially propagates its contents unchanged through the next subsequent bit register 21 to the Data Out terminal 32. If it is desired to load the bit registers 21 serially, the input multiplexer 24 is enabled to pass serial data.

Several techniques can be used with CrossCheck to drive the parallel inputs to a zero logic value. In a first technique, the sense lines 12, 14, 16, 18 may be driven with one precharge control line 33 through a plurality of precharge transistors 34. Another technique, which is available directly from a CrossCheck test structure, is to employ an existing probe line of the grid structure that is not used to test parts for driving the row of CrossCheck test points to which the probe line is connected to a logic zero level.

In certain cases, it may be useful to load the parallel data into the register without compressing it into a signature for later shifting to the serial output unchanged. This can be done in a manner analogous to the above in which one input to the exclusive-OR is set to zero. In this case, however, the second input to each exclusive-OR gate, the one coming from the previous register bit must be set to zero. This is done by loading zero logic values into the bit register 21 through the serial Data In terminal 31 and serially shifting this data through the bit registers 21 using the method described above until the LFSR is fully loaded with zeros. If test data is placed on the parallel inputs, it will be loaded unchanged into the LFSR on the next clock pulse. Driving the parallel inputs to zero once again and clocking the register will transfer this data unchanged to the output.

The invention has now been described with reference to specific embodiments. Other embodiments will be apparent to those of ordinary skill in the art. It is therefore not intended that this invention be limited, except as indicated in the appended claims.

What is claimed is:

1. In a CrossCheck test structure having sense lines coupled to supply digital binary data in parallel to an array of serially-coupled bit registers for propagating data serially to an output terminal and in feedback toward a first bit register, a method for operating said bit registers configured as a linear feedback shift register with parallel inputs as a serial shift register comprising the steps of:

providing only a single dual-input multiplexer coupled to receive, as a feedback signal at a first input, data from output of at least one bit register and, as serial input data at a second input, serial data directed from an input terminal and to provide serial data to a first terminal of a first dual-input exclusive-OR gate;

providing as a stage for each sense line:

a first dual-input exclusive-OR gate coupled at a first terminal to receive serial data from a prior stage and at a second terminal to receive parallel data from sense lines of a test structure;

a bit register coupled to receive output data from said dual-input exclusive-OR gate and coupled to provide serial data to a next stage;

selecting at said single multiplexer to receive serial input data at said second input; and setting all of said sense lines to a logic zero level such that, upon clocking of said bit registers, serial data is propagated through said bit registers in unmodified form.

2. The method according to claim 1 for loading the linear feedback shift register in parallel without modifying data so loaded, said method further comprising the steps of:

sending a sequence of null data from said input terminal to said second input of said multiplexer, said null data being of sufficient duration to produce logic zeroes in all said bit registers; thereafter connecting said sense lines to data signals intended to be loaded in said bit registers; and thereafter, while maintaining null data on said second input, loading data in parallel from said sense lines into said bit registers by clocking said bit registers once simultaneously.

3. The method according to claim 2 further including the steps of:

setting all of said sense lines to logic zero; and thereafter transferring data in said bit registers to said output terminal by again clocking said bit registers.

4. The method according to claim 1 wherein said setting step comprises applying signals through precharge transistors coupled to said sense lines.

5. The method according to claim 1 wherein said setting step comprises coupling a row of CrossCheck test sites to a logic zero level; and selecting a probe line for said row.

6. In a CrossCheck test structure employing a set of bit registers for propagating data serially to an output terminal without modification and in feedback toward a first bit register for data compression, a linear feedback shift register means capable of operating in a serial feedback shift register mode and a parallel input mode comprising:
- a single dual input multiplexer coupled to receive, as a feedback signal at a first input, data from output of at least one bit register and, as serial input data at a second input, data directed from an input terminal and to provide serial data to a first terminal of a first dual-input exclusive-OR gate;
- as a stage for each sense line:
  - a dual-input exclusive-OR gate coupled at a first terminal to receive serial data from a prior stage and at a second terminal to receive parallel data from sense lines of a test structure;
  - a bit register coupled to receive output data from said dual-input exclusive-OR gate and coupled to provide serial data to a next stage; and
- means for setting all of said sense lines to a logic zero level such that serial data is propagated through said bit registers in unmodified form.

* * * * *